United States Patent
Otsuka et al.

(10) Patent No.: US 7,803,280 B2
(45) Date of Patent: Sep. 28, 2010

(54) METHOD FOR FINISHING SURFACE OF PRELIMINARY POLISHED GLASS SUBSTRATE

(75) Inventors: Koji Otsuka, Tokyo (JP); Kenji Okamura, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/475,878

(22) Filed: Jun. 1, 2009

(65) Prior Publication Data
US 2009/0233192 A1 Sep. 17, 2009

Related U.S. Application Data

(63) Continuation of application No. PCT/JP2007/072689, filed on Nov. 22, 2007.

(30) Foreign Application Priority Data
Dec. 1, 2006 (JP) .............................. 2006-325286

(51) Int. Cl.
B44C 1/22 (2006.01)
C03C 15/00 (2006.01)
(52) U.S. Cl. .............................. 216/12; 216/24; 216/59; 216/60; 216/62; 216/66; 216/67; 216/76; 216/80; 204/192.33; 204/192.34
(58) Field of Classification Search .................. None
See application file for complete search history.

(56) References Cited

U.S. PATENT DOCUMENTS

| | | | |
|---|---|---|---|
| 6,251,835 B1 * | 6/2001 | Chu et al. .................... 505/411 |
| 7,374,642 B2 * | 5/2008 | Deutchman et al. ..... 204/192.11 |
| 7,622,050 B2 * | 11/2009 | Otsuka et al. .................. 216/66 |
| 2003/0029836 A1 * | 2/2003 | Lindstrom et al. ............ 216/67 |
| 2004/0192063 A1 * | 9/2004 | Koike .......................... 438/736 |
| 2004/0192171 A1 * | 9/2004 | Koike ............................ 451/5 |
| 2005/0003672 A1 * | 1/2005 | Kools et al. .................. 438/698 |
| 2007/0059608 A1 * | 3/2007 | Ikuta et al. ...................... 430/5 |
| 2007/0125747 A1 * | 6/2007 | Otsuka et al. .................. 216/66 |
| 2007/0259605 A1 * | 11/2007 | Otsuka et al. .................. 451/8 |
| 2008/0142480 A1 | 6/2008 | Otsuka |

FOREIGN PATENT DOCUMENTS

JP 9-21606 1/1997

(Continued)

OTHER PUBLICATIONS

U.S. Appl. No. 12/648,481, filed Dec. 29, 2009, Ito, et al.

*Primary Examiner*—Anita K Alanko
(74) *Attorney, Agent, or Firm*—Oblon, Spivak, McClelland, Maier & Neustadt, L.L.P.

(57) ABSTRACT

The invention provides a method in which waviness generated on a glass substrate surface during pre-polishing is removed, thereby finishing the glass substrate to have a surface excellent in flatness. The method for finishing a pre-polished glass substrate uses ion beam etching, gas cluster ion beam etching or plasma etching, the method including: a step of measuring flatness of the glass substrate surface using a shape measurement unit, and a step of measuring a concentration distribution of the dopant contained in the glass substrate. Processing conditions of the glass substrate surface are set up for each site of the glass substrate based on the results obtained from the step of measuring flatness and the step of measuring a concentration distribution of the dopant. Finishing includes keeping an angle formed by a normal line of the glass substrate and an incident beam onto the glass substrate at from 30° to 89°.

20 Claims, 2 Drawing Sheets

FOREIGN PATENT DOCUMENTS

| | | |
|---|---|---|
| JP | 9-266186 | 10/1997 |
| JP | 2001-110767 | 4/2001 |
| JP | 2002-316835 | 10/2002 |
| JP | 2003-505891 | 2/2003 |
| JP | 2003-159636 | 6/2003 |
| JP | 2004-315351 | 11/2004 |
| JP | 2006-8426 | 1/2006 |
| JP | 2006-76816 | 3/2006 |
| JP | 2006-126082 | 5/2006 |
| JP | 2006-133629 | 5/2006 |
| JP | 2006-240977 | 9/2006 |
| WO | WO 2006135098 A1 * | 12/2006 |

* cited by examiner

METHOD FOR FINISHING SURFACE OF PRELIMINARY POLISHED GLASS SUBSTRATE

TECHNICAL FIELD

The present invention relates to a method for finishing a pre-polished glass substrate surface. In particular, the invention relates to a method for finishing a surface of a glass substrate required to have high flatness, like glass substrates for use as reflective type masks for EUV (extreme ultraviolet) lithography in semiconductor production steps. Furthermore, the invention relates to a glass substrate finished using the method of the invention. Furthermore, the invention relates to a photomask and a mask blank using the glass substrate and to an exposure tool using the glass substrate as an optical element of an optical system.

BACKGROUND ART

In the lithographic technology, lithographic exposure tools for transferring a fine circuit pattern onto a wafer to produce an integrated circuit have hitherto been extensively used. With the trend toward a high degree of integration, a high speed and a high function in an integrated circuit, the integrated circuits are becoming finer, and the exposure tools are required to have a large focal depth and form a high-resolution circuit pattern image on a wafer surface. The wavelengths of exposure light sources are becoming shorter. ArF excimer lasers (wavelength: 193 nm) have come to be used as exposure light sources in place of the g-line (wavelength: 436 nm), i-line (wavelength: 365 nm) and KrF excimer lasers (wavelength: 248 nm) heretofore in use. Furthermore, use of an $F_2$ laser (wavelength: 157 nm) as an exposure light source for conforming to next-generation integrated circuits having a line width of not more than 100 nm is thought to be promising. However, the generations which can be covered by this light source are regarded as being limited to ones with line widths down to 70 nm.

Under such technological trends, a lithographic technique employing EUV light as a next-generation exposure light source is thought to be applicable to plural generations of 45 nm and finer and is attracting attention. The EUV light as referred to herein refers to light having a wavelength band in the soft X-ray region or vacuum ultraviolet region. Specifically, it refers to light having a wavelength of from about 0.2 to 100 nm. At present, use of a lithographic light source of 13.5 nm is being investigated. The exposure principal in this EUV lithography (hereinafter abbreviated as "EUVL") is equal to that in the conventional lithography in the point that a mask pattern is transferred with an optical projection system. However, since there is no material which transmits light in the EUV light energy region, a refractive optical system cannot be used, and a reflective optical system should be used (see Patent Document 1).

The reflective type mask for use in EUVL is basically constituted of (1) a glass substrate, (2) a reflecting multilayered film formed on the glass substrate and (3) an absorber layer formed on the reflecting multilayered film. As the reflecting multilayered film, a film having a structure formed by periodically stacking, in an nm-order thickness, materials having a different refractive index at the wavelength of the exposure light from each other is used. Known typical materials are Mo and Si.

Furthermore, Ta and Cr are being investigated for the absorber layer. The glass substrate is required to be made of a material having a low coefficient of thermal expansion so as not to be distorted even upon irradiation with EUV light. Use of a glass having a low coefficient of thermal expansion or a crystallized glass having a low coefficient of thermal expansion is being investigated. In this description, a glass having a low coefficient of thermal expansion and a crystallized glass having a low coefficient of thermal expansion are hereinafter referred to inclusively as "low-expansion glass" or "ultralow-expansion glass".

The low-expansion glass or ultralow-expansion glass most widely used in EUVL reflective type masks is quartz glass which comprises $SiO_2$ as a main component and to which $TiO_2$, $SnO_2$ or $ZrO_2$ is added as a dopant for the purpose of reducing a coefficient of thermal expansion of glass.

A glass substrate is produced by processing such a glass or crystallized glass material with high accuracy and cleaning it. In the case of processing a glass substrate, in general, a surface of the glass substrate is pre-polished at a relatively high processing rate until the glass substrate surface has given flatness and RMS in a high spatial frequency (HSFR) region; and thereafter, the glass substrate surface is finished by a method having higher processing accuracy or under processing conditions bringing about higher processing accuracy so as to result in desired flatness and RMS in an HSFR region.

Patent Document 2 discloses that the polishing method and device disclosed therein are suitable for polishing processing of an optical element with high accuracy comprising a fluoride based crystal material such as calcium fluoride, magnesium fluoride, etc., which is suitable for various optical elements used over a wide wavelength range of from a vacuum ultraviolet region to a far-infrared region, lenses, window materials, prisms, etc. Furthermore, Patent Document 3 discloses that the production method of a glass substrate for use in mask blanks disclosed therein reduces or eliminates adverse influences by striae of the glass substrate for use in mask blanks or by reflection on the back surface, measures the irregular shape on the surface of the glass substrate to be measured with high accuracy, and controls the flatness with extremely high accuracy based on the measurement results, thereby realizing a high flatness.

The polishing method and device described in Patent Document 2 are based on the assumption that in the case of works comprising a crystal material are uniformly polished at a constant rate and a constant pressure utilizing a tool which is sufficiently small relative to the works, the removal amount is equal. However, the polishing tool disclosed in this patent document is one prepared by laminating a circular pitch or foamed polyurethane, as a polishing pad, onto a base metal; in the polishing method described in this patent document, such a polishing tool is pressed against the surface to be processed while being rotated and while applying a polishing liquid containing diamond fine powder thereto and continuously moved and scanned from end to end on the lens surface. Therefore, there is a concern that even when polishing is uniformly effected at a constant rate and a constant pressure, the polishing amount does not become constant depending upon the abrasion and clogging of the polishing pad and the concentration and entrance of the diamond slurry to the polishing pad.

In the method disclosed in Patent Document 3, it is necessary to make the distance L1 between surfaces A and B and the distance L2 between surfaces C and D relatively large in the surface shape measurement device 2 shown in FIG. 2 of this patent document. Specifically, it is necessary that the distances L1 and L2 are made to be about several tens mm. In measuring the surface shape, it is liable to be influenced by air fluctuation of this space. In particular, when a downflow is applied for the purpose of increasing the degree of cleanness within the surface shape measurement processing device, the influences of air fluctuation become remarkable.

Patent Document 1: JP-T-2003-505891
Patent Document 2: JP-A-2003-159636
Patent Document 3: JP-A-2006-133629

DISCLOSURE OF THE INVENTION

Problems that the Invention is to Solve

There may be the case where, when a glass substrate for use in an EUVL reflective type mask is processed, partial waviness is generated on the glass substrate surface. The present inventors have found that the generation of this waviness is attributable to a partial difference in the composition of the glass substrate, more specifically, to the distribution of the concentration of the dopant contained in the glass substrate. There is a concern that waviness may be caused on the glass substrate surface upon each of pre-polishing and finishing. However, there is a concern that pre-polishing with a high processing rate may cause larger waviness on the glass substrate surface. In the case where pre-polishing caused large waviness, it was difficult for finishing to remove the waviness, thereby making the glass substrate surface have a desired flatness. Furthermore, there may also be the case where the waviness caused during the pre-polishing grows to larger waviness during the finishing.

In order to solve the foregoing problems, an object of the invention is to provide a method in which waviness generated on a glass substrate surface during pre-polishing is removed, and the glass substrate is finished so as to have a surface which is excellent in flatness.

Furthermore, an object of the invention is to provide a method in which the glass substrate processed so as to have a surface which is excellent in flatness is further finished into a surface which is excellent in an RMS slope and an RMS in an HSFR region.

Furthermore, an object of the invention is to provide a glass substrate finished by the foregoing method of the invention, which is excellent in an RMS slope, an RMS in an HSFR region and flatness.

Furthermore, an object of the invention is to provide a photomask and a mask blank using the foregoing glass substrate.

Furthermore, an object of the invention is to provide an exposure tool which is used as an optical element of an optical system using the foregoing glass substrate.

Means for Solving the Problems

In order to achieve the foregoing objects, the invention provides a method for finishing a pre-polished glass substrate surface using any one of processing methods selected from the group consisting of ion beam etching, gas cluster ion beam etching and plasma etching, the glass substrate being made of quartz glass that contains a dopant and comprising $SiO_2$ as a main component, and the method for finishing a pre-polished glass substrate surface comprising the steps of:

measuring flatness of the glass substrate surface using a shape measurement unit that comprises: a low-coherent light source whose outgoing light flux has a coherence length shorter than twice an optical distance between front and back surfaces of the glass substrate; a path match route part that divides the outgoing light flux from the low-coherent light source into two light fluxes, causes one of the two light fluxes to make a detour by a given optical path length relative to the other light flux, and then recombines the light fluxes into a single light flux and outputs it; and an interference optical system that acquires an interference fringe which carries wave surface information of the glass substrate surface by radiating an outgoing light flux from the low-coherent light source onto a reference surface and the glass substrate surface held on a measurement optical axis and making lights returning from the reference surface and the glass substrate surface interfere with each other, and measuring a concentration distribution of the dopant contained in the glass substrate, wherein processing conditions of the glass substrate surface are set up for each site of the glass substrate based on results obtained from the step of measuring a surface shape of the glass substrate and the step of measuring a concentration distribution of the dopant contained in the glass substrate, and the finishing is carried out while keeping an angle formed by a normal line of the glass substrate and an incident beam onto the glass substrate surface at from 30 to 89° (this method will be hereinafter referred to as "finishing method the invention").

In the finishing method of the invention, it is preferred that correlation between the concentration of the dopant contained in the glass substrate and the processing rate of the glass substrate surface is determined beforehand, that after measuring the flatness of the glass substrate surface, a given amount of the glass substrate surface is processed under certain processing conditions, and the flatness of the glass substrate surface after the processing is then measured, and that the concentration distribution of the dopant contained in the glass substrate is measured using a difference in the flatness of the glass substrate surface before and after the processing and the correlation between the concentration of the dopant and the processing rate.

In the finishing method of the invention, it is preferred that the flatness of the glass substrate surface before and after the processing is measured using the shape measurement unit comprising the low-coherent light source, the path match route part and the interference optical system.

In the finishing method of the invention, it is preferred that the width of waviness present on the glass substrate surface is specified from the results of the step of measuring flatness of the glass substrate surface, and that the processing is carried out using a beam having a beam diameter of not more than the width of the waviness in terms of an FWHM (full width of half maximum) value.

It is more preferred that the FWHM value of the beam diameter is not more than one-half the width of the waviness.

In the finishing method of the invention, it is preferred that the processing method is gas cluster ion beam etching; and it is preferred to use, as a source gas of the gas cluster ion beam etching, any one of mixed gases selected from the group consisting of a mixed gas of $SF_6$ and $O_2$, a mixed gas of $SF_6$, Ar and $O_2$, a mixed gas of $NF_3$ and $O_2$, a mixed gas of $NF_3$, Ar and $O_2$, a mixed gas of $NF_3$ and $N_2$ and a mixed gas of $NF_3$, Ar and $N_2$.

In the finishing method of the invention, it is preferred that the glass substrate is made of a low-expansion glass having a coefficient of thermal expansion at 20° C. of 0±30 ppb/° C.

In the finishing method of the invention, it is preferred that the dopant is $TiO_2$.

In the finishing method of the invention, it is preferred that the glass substrate has an RMS in a high spatial frequency (HSFR) region of the substrate surface after the pre-polishing of not more than 5 nm.

In the finishing method of the invention, it is preferred that the glass substrate surface finished by setting up the processing conditions for each site of the glass substrate is further subjected to second finishing for improving an RMS in a high spatial frequency (HSFR) region.

It is preferred that the second finishing is carried out by gas cluster ion beam etching while keeping an angle formed by a normal line of the glass substrate and an incident gas cluster ion beam into the glass substrate surface at from 30 to 89° and using, as a source gas, an $O_2$ single gas or a mixed gas of $O_2$ and at least one gas selected from the group consisting of Ar, CO and $CO_2$ at an accelerating voltage of 3 kV or more and less than 30 kV.

Furthermore, it is preferred that the second finishing is carried out by mechanical polishing using a polishing slurry at a surface pressure of from 1 to 60 $g_f/cm^2$.

Furthermore, the invention provides a glass substrate having a substrate surface that satisfies the following requirements (1) and (2) (this glass substrate will be hereinafter referred to as "glass substrate (1) of the invention").

(1) an RMS slope in the region that 5 μm<λ(spatial wavelength)<1 mm is not more than 0.5 mRad.

(2) an RMS slope in the region that 250 nm<λ(spatial wavelength)<5 μm is not more than 0.6 mRad.

Furthermore, the invention provides a glass substrate having a substrate surface that satisfies the following requirements (3) and (4) (this glass substrate will be hereinafter referred to as "glass substrate (2) of the invention").

(3) an RMS slope in the region that 2.5 μm<λ(spatial wavelength)<1 mm is not more than 0.45 mRad.

(4) an RMS slope in the region that 250 μm<λ(spatial wavelength)<2.5 μm is not more than 0.5 mRad.

Furthermore, the invention provides a glass substrate having a substrate surface that satisfies the following requirements (5) and (6) (this glass substrate will be hereinafter referred to as "glass substrate (3) of the invention").

(5) an RMS in the region that 100 nm<λ(spatial wavelength)<1 μm is not more than 0.1 nm.

(6) an RMS in the region that 50 nm<λ(spatial wavelength)<250 nm is not more than 0.15 nm.

Furthermore, the invention provides a glass substrate having a substrate surface that satisfies the following requirements (3) to (6) (this glass substrate will be hereinafter referred to as "glass substrate (4) of the invention").

(3) an RMS slope in the region that 2.5 μm<λ(spatial wavelength)<1 mm is not more than 0.45 mRad.

(4) an RMS slope in the region that 250 nm<λ(spatial wavelength)<2.5 μm is not more than 0.5 mRad.

(5) an RMS in the region that 100 nm<λ(spatial wavelength)<1 μm is not more than 0.1 nm.

(6) an RMS in the region that 50 nm<λ(spatial wavelength)<250 nm is not more than 0.15 nm.

The glass substrate (1) of the invention is preferably obtained by the finishing method of the invention; and it is preferred that the substrate surface after the second finishing satisfies the foregoing requirements (1) and (2).

The glass substrate (2) of the invention is preferably obtained by the finishing method of the invention; and it is preferred that the substrate surface after the second finishing satisfies the foregoing requirements (3) and (4).

The glass substrate (3) of the invention is preferably obtained by the finishing method of the invention; and it is preferred that the substrate surface after the second finishing satisfies the foregoing requirements (5) and (6).

The glass substrate (4) of the invention is preferably obtained by the finishing method of the invention; and it is preferred that the substrate surface after the second finishing satisfies the foregoing requirements (3) to (6).

In the glass substrates (1) to (4) of the invention, it is preferred that the flatness of the substrate surface after the second finishing is not more than 50 nm.

In the glass substrates (1) to (4) of the invention, it is preferred that the RMS in a high spatial frequency (HSFR) region of the substrate surface after the second finishing is not more than 0.15 n (RMS).

Furthermore, the invention provides a photomask blank obtained from the foregoing glass substrates (1) to (4) of the invention.

Furthermore, the invention provides a photomask obtained from the foregoing mask blank of the invention.

Furthermore, the invention provides an exposure tool using the glass substrate of the invention as an optical element of an optical system.

ADVANTAGES OF THE INVENTION

In the finishing method of the invention, since the flatness of the glass substrate surface after the pre-polishing and the concentration distribution of the dopant contained in the glass substrate are measured, and the processing conditions of the glass substrate surface are set up for each site of the glass substrate based on the measurement results, the waviness generated on the glass substrate surface during the pre-polishing can be effectively removed. Furthermore, since the processing conditions of the glass substrate surface are set up for each site of the glass substrate based on the measurement results of the concentration distribution of the dopant contained in the glass substrate, there is no concern that waviness is newly generated on the glass substrate surface during the finishing, or the waviness generated during the pre-polishing grows during the finishing. Consequently, according to the finishing method of the invention, the glass substrate can be processed so as to have a surface with an excellent flatness.

In addition, by carrying out the second finishing, the glass substrate can be processed so as to have a surface with excellent RMS slope and RMS in an HSFR region.

Since the glass substrate finished by the invention is excellent in an RMS slope, an RMS in an HSFR region and flatness, it is suitable for an optical element of an optical system of an exposure tool, in particular, an optical element to be used in an optical system of an exposure tool for semiconductor production of next generations having a line width of 45 nm or finer, and for a photomask and a mask blank to be used for the production thereof, in particular, a reflective type mask for use in EUVL, and for a mask blank to be used for the production of the mask.

DESCRIPTION OF REFERENCE NUMERALS AND SIGNS

Figure 1:
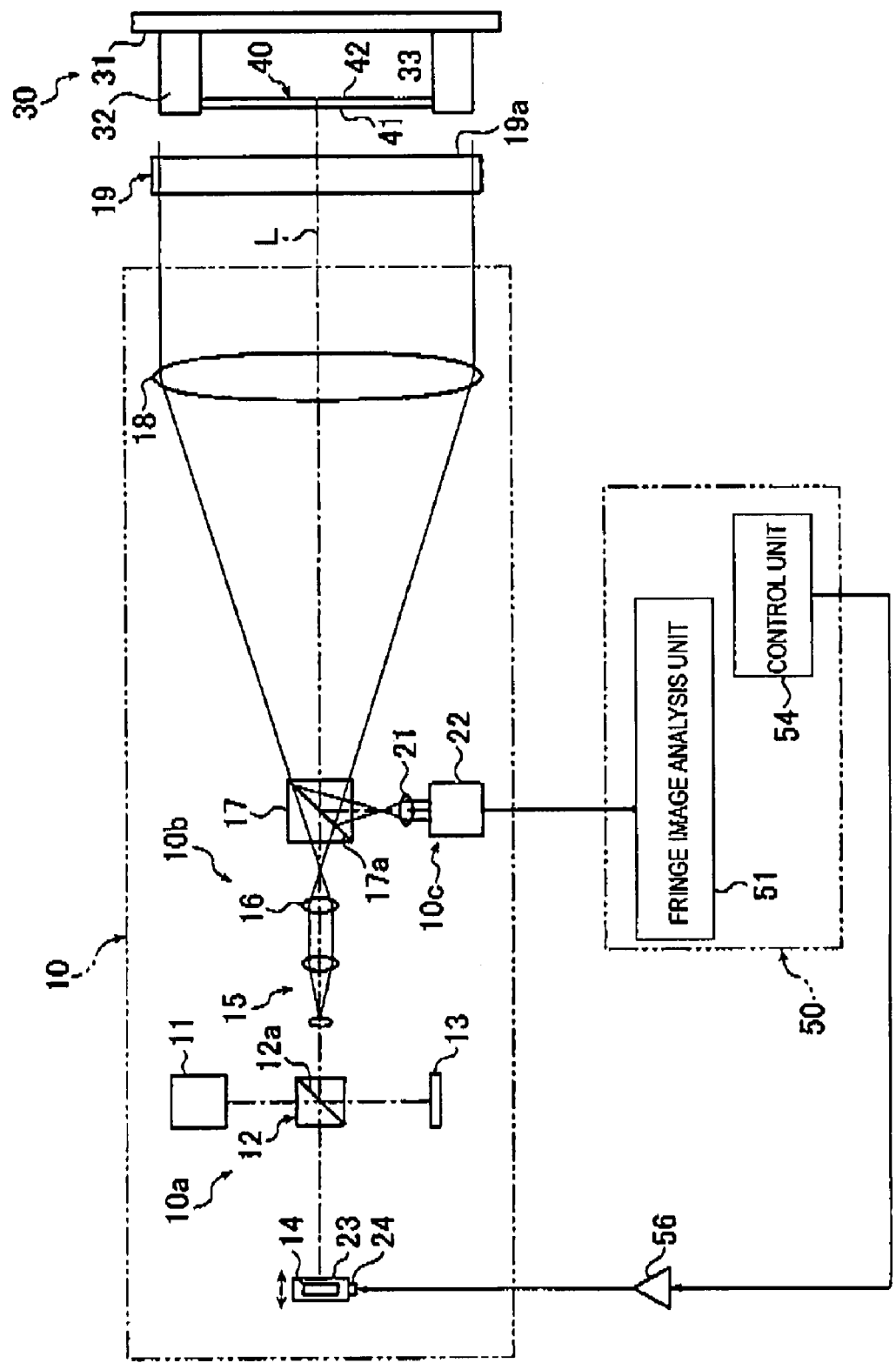
FIG. 1 is a diagrammatic configuration view showing an embodiment of a shape measurement unit which is used in the step of measuring surface flatness.

10: Interferometer
10a: Path match route part
10b: Interference optical system
10c: Imaging system
11: Light source
12, 17: Beam splitter 12a, 17a: Half mirror surface
13, 14: Mirror
15: Beam expander
16: Convergent lens
18: Collimator lens
19: Transmissive reference plate
19a: Reference plane
21: Image formation lens
22: Imaging camera
23: Uniaxial stage
24: Actuator
30: Glass substrate-holding unit
31: Back-plate part
32, 33: Support member
40: Glass substrate
41: Front surface
42: Back surface
50: Computer device (analyzing means)
51: Fringe image analysis unit
54: Control unit
56: Driving driver

BEST MODES FOR CARRYING OUT THE INVENTION

The finishing method of the invention is a method for finishing a glass substrate surface after the pre-polishing. More specifically, it is a method in which waviness generated on the glass substrate surface during the pre-polishing is removed, and the glass substrate is finished so as to have a surface with excellent flatness.

The pre-polishing as referred to herein is a procedure in which a glass substrate surface is processed at a relatively high processing rate to some extent of flatness and RMS in a high spatial frequency (HSFR) region before being processed to given flatness and RMS in an HSFR region. The pre-polished glass substrate surface is finished so as to have given flatness and RMS in an HSFR region.

The RMS in an HSFR region of the glass substrate surface after the pre-polishing is preferably not more than 5 nm, and more preferably not more than 1 mm. The RMS in an HSFR region as referred to in this specification means a surface roughness in a region of a spatial wavelength of from 50 to 250 nm as measured by an atomic force microscope (AFM) on an area of from 1 to 10 μm square. When the RMS in an HSFR region on the glass substrate surface after the pre-polishing exceeds 5 nm, it takes a considerably long period of time to finish the glass substrate surface by the finish polishing method of the invention, which leads to a factor of increasing the costs.

The processing method which is used for the pre-polishing is not particularly limited and can be widely selected among known processing methods used for processing a glass surface. In general, however, a mechanical polishing method is used because it has a high processing rate, and a large area can be polished at a time by using a polishing pad having a large surface area. The mechanical polishing method as referred to herein also includes, in addition to polishing only by a polishing action by abrasive grains, a method using a polishing slurry in which a polishing action by abrasive grains is combined with a chemical polishing action by a chemical. The mechanical polishing method may be any of lapping and polishing, and a polishing tool and an abrasive to be used can be appropriately selected among known ones. When a mechanical polishing method is used, for the purpose of increasing the processing rate, in the case of lapping, the surface pressure is preferably from 30 to 70 gf/cm$^2$, and preferably from 40 to 60 gf/cm$^2$; and in the case of polishing, the surface pressure is more preferably from 60 to 140 gf/cm$^2$, and more preferably from 80 to 120 gf/cm$^2$. In the case of lapping, the polishing amount is preferably from 100 to 300 μm; and in the case of polishing, the polishing amount is preferably from 1 to 60 μm.

When mechanical polishing is carried out at the foregoing surface pressure and polishing amount, waviness is generated on the glass substrate surface due to a rate difference by composition distribution of a substrate such as a concentration distribution of the dopant contained in the glass substrate. However, the waviness generated on the glass substrate surface during the pre-polishing can be effectively removed by the finishing method of the invention.

The waviness as referred to herein means one having periodic concaves and convexes of from 5 to 30 mm among those present on the glass substrate surface. The finishing method of the invention is a method of effectively removing the waviness generated on the glass substrate surface during the pre-polishing.

The finishing method of the invention is suitable for finishing of a glass substrate for use in an EUVL reflective type mask which can conform to the trend toward a high degree of integration and a high definition in an integrated circuit. The glass substrate which is used in this application is a glass substrate having a low coefficient of thermal expansion and a reduced fluctuation thereof. The glass substrate is preferably made of a low-expansion glass having a coefficient of thermal expansion at 20° C. of 0±30 ppb/° C., and more preferably made of an ultralow-expansion glass having a coefficient of thermal expansion at 20° C. of 0±10 ppb/° C.

Most widely used as such low-expansion glass and ultralow-expansion glass is quartz glass which comprises $SiO_2$ as a main component and to which a dopant is added for the purpose of reducing a coefficient of thermal expansion of glass. A typical example of the dopant to be added for the purpose of reducing a coefficient of thermal expansion of glass is $TiO_2$. Specific examples of the low-expansion glass and ultralow-expansion glass to which $TiO_2$ is added as a dopant include ULE (a registered trademark) Code 7972 (manufactured by Corning Incorporated).

In the finishing method of the invention, the glass constituting the glass substrate is quartz glass which comprises $SiO_2$ as a main component and to which a dopant is added. A typical example thereof is quartz glass to which $TiO_2$ is added for the purpose of reducing a coefficient of thermal expansion of glass. However, the glass constituting the glass substrate is not limited thereto and may be quartz glass which comprises $SiO_2$ as a main component and to which a dopant is added for other purpose than the foregoing purpose. In this specification, quartz glasses which comprise $SiO_2$ as a main component and to which any dopant is added are hereinafter referred to inclusively as "doped quartz glass".

Examples of the doped quartz glass to which a dopant is added for other purpose than the purpose of reducing a coefficient of thermal expansion include doped quartz glass to which $La_2O_3$, $Al_2O_3$, $ZrO_2$ or N is added for the purpose of increasing an absolute refractive index of glass; and doped quartz glass to which F is added for the purpose of enhancing the laser resistance of glass.

The dopant content in the doped quartz glass varies depending on the kind of the dopant and the purpose of incorporating the dopant. In the case of doped quartz glass to which $TiO_2$ is added for the purpose of reducing a coefficient of thermal expansion of glass, it is preferred that $TiO_2$ is incorporated in an amount of from 1 to 12% by mass relative to $SiO_2$. When the $TiO_2$ content is less than 1% by mass, there is a concern that the coefficient of thermal expansion of glass cannot be sufficiently reduced. When the $TiO_2$ content exceeds 12% by mass, the coefficient of thermal expansion becomes large toward the negative side and is less than −30 ppb/° C. The $TiO_2$ content is more preferably from 5 to 9% by mass.

So far as the waviness generated on the glass substrate surface during the pre-polishing can be removed by the procedures described below, the finishing method of the invention is applicable to other glass substrates than those made of doped quartz glass. Consequently, the finishing method of the invention is thought to be also applicable to low-expansion crystallized glasses containing $TiO_2$ or $ZrO_2$ as a crystal nucleus.

The shape, size, thickness, etc. of the glass substrate are not particularly limited. However, in the case of a substrate for use in an EUVL reflective type mask, its shape is a plate-shaped body having a rectangular or square shape in terms of a planar shape.

The finishing method of the invention includes a step of measuring flatness of the glass substrate surface (hereinafter referred to as "surface flatness measurement step") and a step of measuring a concentration distribution of a dopant contained in the glass substrate (hereinafter referred to as "dopant concentration distribution measurement step"), and processing conditions of the glass substrate surface are set up for each site of the glass substrate based on the results obtained from these steps. In this specification, setting up the processing conditions of the glass substrate surface for each site of the glass substrate are hereinafter simply referred to as "to set up processing conditions of the glass substrate".

In the surface flatness measurement step, the flatness of the glass substrate surface is measured using a shape measurement unit provided with a low-coherent light source whose outgoing light flux has a coherence length shorter than twice an optical distance between front and back surfaces of the glass substrate; and a path match route part that divides the outgoing light flux from the low-coherent light source into two light fluxes, causes one of the two light fluxes to make a detour by a given optical path length relative to the other light flux, and then recombines the beams into a single light flux and outputs it.

The invention is hereunder described in detail with reference to the drawing. FIG. 1 is a diagrammatic configuration view showing an embodiment of the shape measurement unit which is used in the surface flatness measurement step. The shape measurement unit shown in FIG. 1 is used for the purpose of measuring the flatness of a front surface 41 of a glass substrate 40 in a clean room or the like and is configured to include an interferometer 10, a transmissive reference plate 19, a glass substrate-holding unit 30 and a computer device 50 serving as an analyzing means.

The interferometer 10 is provided with a path match route part 10a for adjusting an optical path length of a measurement beam, an interference optical system 10b for acquiring an interference fringe and an imaging system 10c for imaging the acquired interference fringe. The path match route part 10a is provided with a beam splitter 12 and two mirrors 13, 14. A light flux output from a light source 11 is divided into two light fluxes on a half mirror surface 12a of the beam splitter 12. The path match route part 10a is configured such that the divided two light fluxes are reflected in an opposite direction to each other by the mirrors 13, 14 and returned to the beam splitter 12; that parts of the respective light fluxes are combined into a single light flux on the half mirror surface 12a; and that the thus combined single light flux is emitted toward the interference optical system 10b as a measurement light flux.

In the path match route part 10a, the mirror 14 is held by a uniaxial stage 23 in such a manner that it is movable in the horizontal direction in the drawing. A path length difference between a reciprocating route between a branch point on the half mirror surface 12a and the mirror 14 (this route will be hereinafter referred to as "first route") and a reciprocating route between this branch point and the mirror 13 (this route will be hereinafter referred to as "second route") can be adjusted by changing the position of the mirror 14 by driving the uniaxial stage 23 by an actuator 24. In the shape measurement unit shown in FIG. 1, one light flux passing through the first route is configured so as to make a detour (traveling a longer way), by a given optical path length, relative to the other light flux passing through the second route.

The light source 11 is configured of a low-coherent light source set up such that a coherence length of an outgoing light flux outputted as a measurement light flux becomes shorter than twice the optical path length between the front surface 41 and the back surface 42 of the glass substrate 40. As such a low-coherent light source, general low-coherent light sources such as LED, SLD, halogen lamps, high mercury vapor pressure lamps, etc.; and wavelength modulation light sources which are adjusted so as to have a coherence length equivalent to the coherence length of the low-coherent light source when an image of an interference fringe is captured by an imaging element can be used. The wavelength modulation light source of this type modulates the wavelength of light emitted from the light source (a semiconductor laser light source (LD) is usually used) within a period of time shorter than a response time of the imaging element (a light storage time) and images an interference fringe in a time-averaged manner within the response time of the imaging element, thereby obtaining a result equivalent to that achieved when a light source emitting light having a wide spectrum width and a short coherence length is employed. For example, a method for compositing a coherence function is described in *Proceedings of Light Wave Sensing, May* 1995, pages 75 to 82. Furthermore, an improved technique based on this method is also disclosed (JP-A-2004-37165).

The interference optical system 10b is provided with a beam expander 15, a convergent lens 16, a beam splitter 17 and a collimator lens 18, which are arranged in sequence of propagation of the measurement light flux emitted from the path match route part 10a. The imaging system 10c is provided with an image formation lens 21 and an imaging camera 22, which are disposed below the beam splitter 17 in the drawing. Furthermore, the interference optical system 10b configures a Fizeau type optical system disposition along with the transmissive reference plate 19. An interference fringe which is formed from reference light reflected from a reference plane 19a of the transmissive reference plate 19 and light returning from the glass substrate 40 after transmitting through the reference plane 19a is formed into an image on an imaging element such as CCD, CMOS, etc. in the imaging camera 22 via a half mirror face 17a of the beam splitter 17 and the image formation lens 21.

Although not illustrated, the transmissive reference plate 19 is provided with a fringe scan adapter for accomplishing fine motion of the transmissive reference plate 19 in the direction of an optical axis L when fringe scan measurement is performed; and a tilt adjustment mechanism for finely adjusting an inclination of the glass substrate 40 held by the glass substrate-holding unit 30 with respect to the reference plane 19a.

The glass substrate-holding unit 30 is provided with a back-plate part 31 and a pair of upper and lower support members 32, 33 for supporting the glass substrate 40 fixed to the back-plate part 31.

The support members 32, 33 are configured so as to vertically come into contact with the glass substrate 40 from the both sides with a normal line of the plane of the glass substrate 40 interposed therebetween (the normal line being coincident with an optical axis L in FIG. 1) and thus hold the glass substrate 40 such that the normal line of the plane becomes substantially perpendicular to the direction of gravity (horizontal direction in the drawing).

Although illustration is omitted, the support members 32, 33 are provided with press members which are provided in positions in the vicinity of the front or back surface or side surface of the glass substrate 40 for preventing tilting of the glass substrate 40. A material which less likely generates dusts, for example, a PEEK material (PEEK: polyetheretherketone), etc., is preferably used for the support members 32, 33 and the press members.

Furthermore, as shown in FIG. 1, the computer device 50 is provided with a fringe image analysis unit 51 which is configured of a microprocessor, various memory devices, arithmetic processing programs stored in the memory devices, etc. and a control unit 54 and also connected with a monitor device for displaying the obtained interference fringe image, etc. and an input device for effecting input operations with respect to the computer device 50 (all of which are not illustrated). The control unit 54 is configured so as to adjust the position of the mirror 14 by controlling the driving amount of the actuator 24 via the driving driver 56.

Procedures for measuring the flatness of the front surface 41 of the glass substrate 40 using the shape measurement unit shown in FIG. 1 are hereunder described.

First, by using the glass substrate-holding unit 30, a pair of the support members 32, 33 is brought into contact with the glass substrate 40 from the both vertical sides thereof with the normal line of the plane of the glass substrate 40 interposed therebetween, thereby arranging the glass substrate 40 such that the normal line of the plane becomes essentially perpendicular to the direction of gravity. At that time, adjustment is performed by using a non-illustrated tilt adjustment mechanism such that the reference plane 19a of the transmissive reference plate 19 and the front surface 41 of the glass substrate 40 become essentially parallel to each other.

Next, the flatness of the front surface 41 of the glass substrate 40 held by the support members 32, 33 is measured using the interferometer 10 and the computer device 50 shown in FIG. 1. The flatness of the glass substrate surface as referred to herein means the flatness of each site of the glass substrate surface, namely a difference in height. Consequently, the measurement results serve as a flatness map showing a difference in height in each site of the glass substrate surface (hereinafter referred to as "flatness map").

In measuring the flatness of the front surface 41 of the glass substrate 40 using the interferometer 10 and the computer device 50 shown in FIG. 1, adjustment of the route length of the measurement light flux is performed in the path match route part 10, thereby eliminating the interference by the light reflected from the back surface 42 of the glass substrate 40.

The light returning from the glass substrate 40 to the reference plane 19a includes first returning light which is reflected on the front surface 41 of the glass substrate 40 after transmitting through this reference plane 19a and second returning light which is reflected on the back surface 42 after entering the inside of the glass substrate 40 from this front surface 41.

Since the front surface 41 of the glass substrate 40 is the surface to be measured in the measurement of the flatness of the glass substrate surface, what is required is information of an interference fringe resulting from interference between the first returning light and the reference light. When interference by light which is reflected from the back surface 42 of the glass substrate 40, namely, interference between the reference light and the second returning light, or interference between the first returning light and the second returning light, is generated, such interference becomes a noise and adversely affects the accuracy of measurement.

In the surface flatness measurement step, by performing adjustment of the route length of the measurement light flux in the path match route part 10a, interference by the light which is reflected from the back surface 42 of the glass substrate 40 is eliminated. Specifically, the adjustment is performed such that the optical path length difference between the first route and the second route coincides with the optical path length difference between the reference light and the first returning light in the interference optical system 10b, within the range of the coherence length of the light source 11. As a result, only the required interference is generated, and unnecessary interference is eliminated.

Since adverse effects by the reflection on the back surface of the substrate are eliminated, the flatness of the glass substrate surface can be measured with high accuracy in the surface flatness measurement step.

Moreover, in the interferometer 10 shown in FIG. 1, a distance between the reference plane 19a of the transmissive reference plate 19 and the front surface 41 of the glass substrate 40 may be small whatever it may be, so far as the both do not come into contact with each other, and, for example, the distance between the both may be in a sub-millimeter order. Consequently, the influence by air fluctuation as in the method disclosed in Patent Document 3 can be neglected.

In measuring the flatness of the glass substrate surface by the shape measurement unit shown in FIG. 1, a holding distortion by the glass substrate-holding unit 30 is formed in the glass substrate 40. However, since the glass substrate 40 is held at a controlled extremely low pressure, the influence against the accuracy of measurement by the holding distortion is very small, and hence, it can be generally neglected.

However, in the case where the requirements regarding the flatness become severer, there is a possibility that the influence against the accuracy of measurement by the holding distortion cannot be neglected. In that case, by measuring the flatness of the glass substrate surface by the following procedures, the flatness of a glass substrate surface in a state free from a holding distortion can be determined.

(a) The flatness of the front surface 41 of the glass substrate 40 is measured using information about an interference fringe generated by the first returning light and the reference light.

(b) The glass substrate 40 is turned over upside down, namely, the glass substrate 40 is held by the glass substrate-holding unit 30 such that the back surface 42 is located on the side of the transmissive reference plate 19, and the flatness of the front surface 41 of the glass substrate 40 is measured using information about an interference fringe generated by the second returning light which, after entering the inside of the glass substrate 40 from the back surface 42, is reflected on the front surface 41 and the reference light.

(c) The holding distortion of the glass substrate 40 is determined from the measurement results obtained in (a) and (b).

(d) The flatness of the front surface 41 of the glass substrate 40 in a state free from a holding distortion is determined from the holding distortion obtained in (c) and the measurement results obtained in (a).

In the case of carrying out the dopant concentration distribution measurement step, correlation between the concentration of the dopant contained in the glass substrate and the processing rate of the glass substrate surface is determined beforehand (hereinafter referred to as "correlation between dopant concentration and processing rate").

The present inventors have found that when a glass substrate made of doped quartz glass is processed, there is some correlation between the dopant concentration and the processing rate.

For example, in the case of doped quartz glass containing $TiO_2$ as a dopant, when the doped quartz glass is processed under constant processing conditions, there is the correlation represented by the following equation (1) between the dopant concentration X (wt %) and the processing rate Y (μm/min).

$$Y = a \cdot X + b \quad (1)$$

In the equation (1), a and b each represents a variable.

Figure 2:
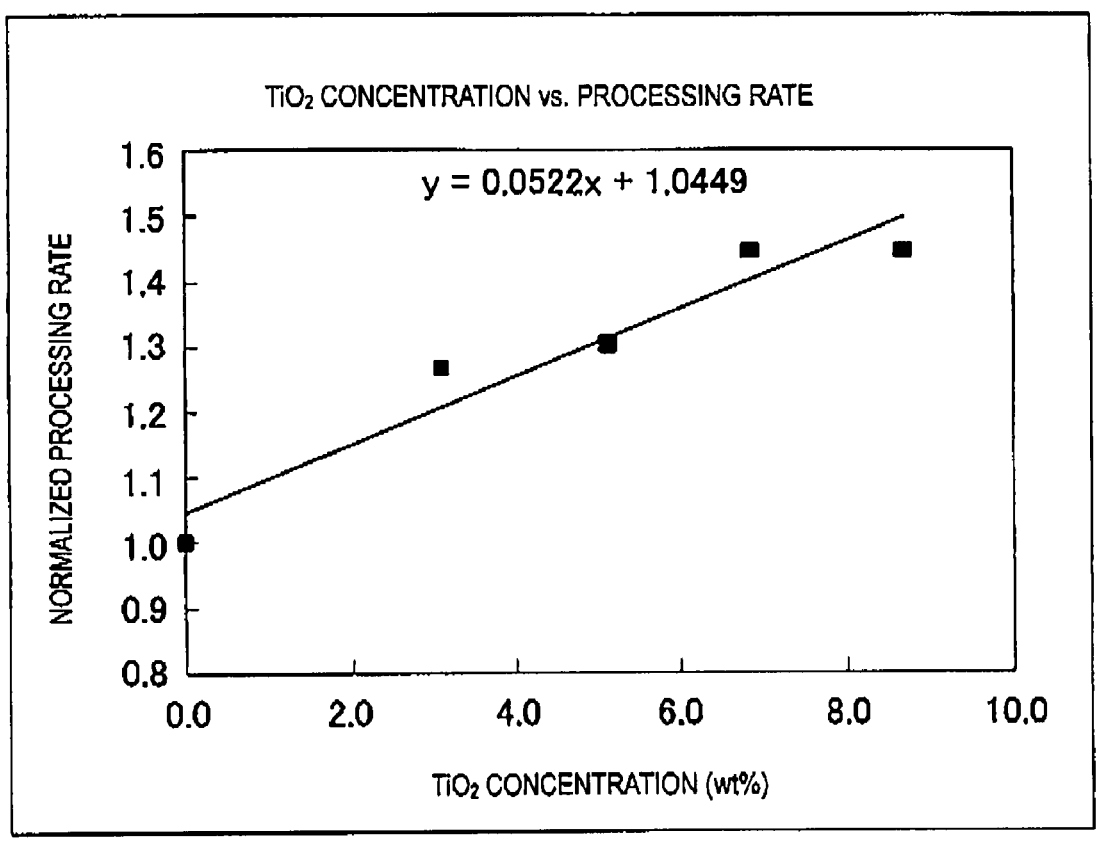
FIG. 2 is a graph showing correlation between dopant concentrations and processing rates regarding doped quartz glass containing $TiO_2$ as a dopant.

FIG. 2 is a graph showing the correlation between dopant concentration and processing rate regarding doped quartz glass containing $TiO_2$ as a dopant, and shows the correlation in the case of using gas cluster ion beam etching as a processing method. The procedures used for preparing FIG. 2 are shown below.

Test samples (20 mm×20 mm×1 mm in thickness) made of doped quartz glass containing $TiO_2$ in an amount of 0%, 3.1%, 5.1%, 6.9% and 8.7%, respectively, in terms of % by mass relative to $SiO_2$ were prepared. These test samples having a different $TiO_2$ concentration from each other were processed under the same conditions, thereby determining a processing rate. A graph obtained by plotting the relationship between the $TiO_2$ concentration and the processing rate is FIG. 2. In FIG. 2, the processing rate is shown as a normalized processing rate while expressing the processing rate at a $TiO_2$ concentration of 0% by mass as 1.

The gas cluster ion beam etching was carried out under the following conditions.

Source gas: $SF_6$ 1.25%, $O_2$ 24%, Ar 74.75%
Accelerating voltage: 30 kV
Ionizing current: 50 μA
Beam diameter (FWHM value): not more than 10 mm
Dose: $6.2 \times 10^{15}$ ions/cm$^2$ The processing rate shown in FIG. 2 was determined from a weight change of the test sample before and after the processing by a gravimetric method.

When the gas cluster ion beam etching is carried out under the foregoing processing conditions, then the foregoing equation (1) is determined as the following equation (1-1) from FIG. 2.

$$Y = 0.0522X + 1.0449 \quad (1\text{-}1)$$

Consequently, the correlation between dopant concentration and processing rate can be determined by preparing plural glass samples in which the glass substrate to be finished in the invention, the matrix component and the kind of the dopant are identical but the dopant concentration is varied; processing these plural glass samples under the same processing conditions; and preparing a graph the same as in FIG. 2.

Next, the following procedures are carried out.

(1) The flatness of the glass substrate surface is measured.

(2) The glass substrate surface is processed in a given amount under constant processing conditions.

(3) The flatness of the glass substrate surface after the processing is measured.

Here, the procedure (1) may be the same as the foregoing surface flatness measurement step. For the purpose of decreasing the step number, it is rather preferred that the procedure (1) is the same as the surface flatness measurement step.

In the procedure (2), the glass substrate surface is uniformly processed under the constant processing conditions using the processing method which is used in determining the correlation between dopant concentration and processing rate. Here, it is preferred that the processing conditions are the same as the processing conditions which are used in determining the correlation between dopant concentration and processing rate. For example, in the case where the processing method is gas cluster ion beam etching, it is preferred that the processing is carried out using the same source gas at the same dose.

The processing which is carried out in the procedure (2) is made for the purpose of measuring the concentration distribution of the dopant contained in the glass substrate and differs from the finishing of the glass substrate surface. Consequently, in order to secure a sufficient processing amount at the time of finishing, it is preferred that the processing amount at which the processing is carried out in the procedure (2) is a processing amount of the necessary minimum for measuring the concentration distribution of the dopant. For example, the processing amount at which the processing is carried out in the procedure (2) is preferably not more than 5,000 nm, more preferably not more than 2,000 nm, and especially preferably not more than 100 nm.

In the procedure (3), it is preferred that the measurement of the flatness of the glass substrate surface is carried out using the shape measurement unit shown in FIG. 1 because the flatness of the glass substrate surface can be measured with high accuracy.

Next, the distribution of processing amount of the glass substrate is determined from a difference in the flatness before and after the processing. That is, the processing amount in each site of the glass substrate is determined from a difference in the flatness obtained in the procedures (1) and (3).

Since the glass substrate is uniformly processed under constant processing conditions, the concentration distribution of the dopant contained in the glass substrate can be determined by comparing the processing amount in each site of the glass substrate with the correlation between dopant concentration and processing rate, which has been determined beforehand. However, since the substrate surface whose flatness is to be measured in the procedure (1) is usually not smooth and has concaves and convexes to some extent, an actual processing amount in each part of the glass substrate cannot be determined from a difference in the flatness obtained in the procedures (1) and (3). For that reason, while expressing an average value of the processing amount (nominal) in each part of the glass substrate determined from a difference in the flatness obtained in the procedures (1) and (3) as a concentration center of the dopant, the concentration distribution of the dopant contained in the glass substrate is determined as a deviation from the concentration center. Here, the concentration center can be made as a target value of the doping amount in a synthesis step of the glass substrate. The concentration center may be corrected by measuring the mass of the glass substrate before and after the processing, determining an actual processing amount from a mass change before and after the processing and using the obtained actual processing amount. As the case may be, the dopant concentration distribution may be corrected.

In the dopant concentration distribution measurement step, the concentration distribution of the dopant contained in the glass substrate, as referred to herein, does not mean the concentration distribution of the dopant in a thickness direction of the glass substrate, but it means, regarding a plate-shaped glass substrate as being of a two-dimensional shape having no thickness, the concentration distribution of the dopant in each site of the two-dimensional shape, namely, the concentration distribution in a plane of the plate-shaped glass substrate. The dopant concentration distribution in a plane parallel to the glass substrate in an arbitrary thickness of the glass substrate is supposed to be equal to the concentration distribution of the measured surface of the glass substrate.

Consequently, the measurement results obtained from the dopant concentration distribution measurement step serve as a dopant concentration distribution map showing the concentration of the dopant in each site of the two-dimensional shape (hereinafter referred to as "dopant concentration distribution map").

In the finishing method of the invention, the processing conditions of the glass substrate surface are set up based on both of the results obtained from the surface flatness measurement step and the results obtained from the dopant concentration distribution measurement step. However, for the sake of facilitating understanding, the description will be made while dividing it into the setting of the processing conditions based on the results obtained from the surface flatness measurement step and the setting of the processing conditions based on the results obtained from the dopant concentration distribution measurement step.

As described above, the results obtained from the surface flatness measurement step serve as a flatness map showing a difference in height in each site of the glass substrate surface. In a glass substrate of a two-dimensional shape having no thickness, which is the conception used with regard to the dopant concentration distribution, when coordinates for the glass substrate are expressed as (x,y), the flatness map is expressed as $S(x,y)$ (μm). When the processing time and processing rate of the glass substrate are expressed as $T(x,y)$ (min) and Y (μm/min), respectively, then the relationship therebetween is expressed by the following equation (2).

$$T(x,y)=S(x,y)/Y \qquad (2)$$

Consequently, in setting up the processing conditions based on the results obtained from the surface flatness measurement step, the processing conditions, specifically the processing time, is set up according to the equation (2).

On the other hand, the results obtained from the dopant concentration distribution measurement step serve as a dopant concentration distribution map showing the concentration of the dopant in each site of the glass substrate. In a glass substrate of a two-dimensional shape having no thickness, which is the conception used with regard to the dopant concentration distribution, when coordinates for the glass substrate are expressed as (x,y), the dopant concentration distribution map obtained from the dopant concentration measure step is expressed as $C(x,y)$ (% by mass). When the processing amount and processing time of the glass substrate are expressed as $W(x,y)$ (μm/min) and $T(x,y)$ (min), respectively, then the relationship between $W(x,y)$ and $T(x,y)$ is expressed by the following equation (3).

$$T(x,y)=W(x,y)/(a \times C(x,y)+b) \qquad (3)$$

W(x,Y) represents a processing amount (predetermined processing amount) of the site of the coordinates (x,y) of the glass substrate and is a constant. For example, when the site of the coordinates (x,y) of the glass substrate is processed in an amount of 5 μm, then W(x,Y) is 5 μm.

Consequently, in setting up the processing conditions of the glass substrate based on the results obtained from the dopant concentration distribution measurement step, the processing conditions of the glass substrate, specifically the processing time, may be set up according to the equation (3).

In the case where the processing conditions of the glass substrate surface are set up based on both of the results obtained from the surface flatness measurement step and the results obtained from the dopant concentration distribution measurement step, when the coordinates of the glass substrate of a two-dimensional shape, the flatness map obtained from the surface flatness measurement step, the dopant concentration distribution map obtained from the dopant concentration distribution measurement step and the processing time are expressed as (x,y), $S(x,y)$ (μm), $C(x,y)$ (% by mass) and $T(x,y)$ (min), respectively, then the relationship among them is expressed by the following equation (4).

$$T(x,y)=S(x,y)/(a \times C(x,y)+b) \qquad (4)$$

Consequently, in setting up the processing conditions based on both of the results obtained from the surface flatness measurement step and the results obtained from the dopant concentration distribution measurement step, the processing conditions of the glass substrate, specifically the processing time, is set up according to the equation (4).

With regard to the processing method which is used in the processing method of the invention, any one of the processing methods selected from the group consisting of ion beam etching, gas cluster ion beam etching and plasma etching is used, because it can make the range to be processed by one processing operation sufficiently small, and because the processing conditions can be easily set up based on the results in the is surface flatness measurement step and the dopant concentration distribution measurement step, for example, it is easy to set up the processing time according to the equation (4). In these methods accompanied with irradiation with a beam onto the glass substrate surface, the energy of a beam to be irradiated onto the glass substrate surface is stable, and even when the energy of a beam fluctuates, the energy of the beam can be confirmed through monitoring. Consequently, there is brought an advantage that the processing can be always achieved under intended processing conditions.

In carrying out such a processing method accompanied with irradiation with a beam onto the glass substrate surface, an angle formed by the normal line of the glass substrate and an incident beam onto the glass substrate surface is kept at from 30 to 89°. When the angle formed by the normal line of the glass substrate and an incident beam onto the glass substrate surface is 30° or more, the reactivity between the substrate and the beam becomes weak so that it is possible to control an RMS at a shorter wavelength. For this reason, an RMS in an HSFR region of the glass substrate and an RMS slope at a wavelength of from 50 nm to 1 mm can be improved. In the case where the foregoing angle is larger than 89°, it is difficult to control the incident beam onto the glass surface, and hence, such is not preferred.

The angle formed by the normal line of the glass substrate and an incident beam onto the glass substrate surface is more preferably from 50 to 85°, and especially preferably from 60 to 80°.

In such a processing method accompanied with irradiation with a beam onto the glass substrate surface, the processing conditions of the glass substrate can be further set up based on the results obtained from the surface flatness measurement step. The procedure of the settings is hereunder specifically described.

In conducting this setting procedure, the results obtained from the surface flatness measurement step are used to specify the width of waviness present on the glass substrate surface. The width of waviness as referred to herein means a length of a concave or a convex in the shape with concaves and convexes present periodically on the glass substrate surface. Consequently, the width of waviness is generally one-half the period of the waviness. In the case where the plural of waviness having a different period from each other is present on the glass substrate surface, the width of the waviness having the shortest period is taken as the width of waviness present on the glass substrate surface.

As described above, the measurement results obtained from the surface flatness measurement step serve as a flatness map showing a difference in height in each site of the glass substrate surface. Consequently, the width of waviness present on the glass substrate surface can be easily specified from the flatness map.

By making the width of waviness specified by the foregoing procedure as a reference, dry etching is carried out using a beam having a beam diameter not more than the width of waviness. Here, the beam diameter is made based on an FWHM (full width of half maximum) value. The beam diameter as referred to in this specification means an FWHM value of the beam diameter. In the finishing method of the invention, it is more preferred to use a beam having a beam diameter not more than one-half the width of waviness. When a beam having a beam diameter not more than the width of waviness is used, the beam can be concentratedly irradiated on the waviness present on the surface of the glass substrate, and the waviness can be effectively removed.

In carrying out such a processing method accompanied with irradiation with a beam, it is necessary to scan the beam on the surface of the glass substrate. This is because for the purpose of setting up the processing conditions of the glass substrate, it is necessary to make the range to be irradiated with a beam in one operation small as far as possible. In particular, when a beam having a beam diameter not more than the width of waviness is used, it is necessary to scan the beam on the surface of the glass substrate. As a method of scanning a beam, raster scanning and spiral scanning are known, and any of them may be used.

In the finish polishing method of the invention, in the case where the processing time (irradiation time of a beam in this case) is set up according to the foregoing equation (4), the settings are conducted so as to obtain an irradiation time $T(x,y)$ at the coordinates $(x,y)$. That is, the settings are conducted so as to obtain an irradiation time $T(x,y)$ set up by determining a relative movement speed between the glass substrate and the beam while taking into consideration a beam intensity profile, a scanning pitch and a dose.

Among the methods accompanied with irradiation with a beam onto the glass substrate surface, it is preferred to use gas cluster ion beam etching because the surface can be processed so as to have a small surface roughness and excellent smoothness.

The gas cluster ion beam etching as referred to herein is a method in which a reactive material (source gas) which is in a gaseous form at normal temperature and normal pressure is injected in a compressed state into a vacuum apparatus through an expansion type nozzle, thereby forming a gas cluster, which is then ionized upon irradiation with an electron to form a gas cluster ion beam, and the gas cluster ion beam is irradiated on an object, thereby etching an object. The gas cluster is generally constituted of a block-shaped atomic or molecular aggregate composed of several thousand atoms or molecules. In the processing method of the invention, in the case where gas cluster ion beam etching is used, when the gas cluster collides with the glass substrate surface, a multi-body collision effect is caused due to an interaction with the solid, whereby the glass substrate surface is processed.

When gas cluster ion beam etching is used, a gas such as $SF_6$, $Ar$, $O_2$, $N_2$, $NF_3$, $N_2O$, $CHF_3$, $CF_4$, $C_2F_6$, $C_3F_8$, $C_4F_6$, $SiF_4$, $COF_2$, etc. can be used singly or in admixture as a source gas. Of these, $SF_6$ and $NF_3$ are excellent as the source gas from the standpoint of a chemical reaction occurring at the time of colliding with the glass substrate surface, and therefore, a mixed gas containing $SF_6$ or $NF_3$ is preferred. Specifically, a mixed gas of $SF_6$ and $O_2$, a mixed gas of $SF_6$, Ar and $O_2$, a mixed gas of $NF_3$ and $O_2$, a mixed gas of $NF_3$, Ar and $O_2$, a mixed gas of $NF_3$ and $N_2$ and a mixed gas of $NF_3$, Ar and $N_2$ are preferred. In these mixed gases, though a suitable mixing proportion of the respective components varies depending on conditions such as irradiation conditions, etc., the following are preferred, respectively.

$SF_6/O_2$=0.1 to 5%/95 to 99.9% (a mixed gas of $SF_6$ and $O_2$)

$SF_6/Ar/O_2$=0.1 to 5%/9.9 to 49.9%/50 to 90% (a mixed gas of $SF_6$, Ar and $O_2$)

$NF_3/O_2$=0.1 to 5%/95 to 99.9% (a mixed gas of $NF_3$ and $O_2$)

$NF_3/Ar/O_2$=0.1 to 5%/9.9 to 49.9%/50 to 90% (a mixed gas of $NF_3$, Ar and $O_2$)

$NF_3/N_2$=0.1 to 5%/95 to 99.9% (a mixed gas of $NF_3$ and $N_2$)

$NF_3/Ar/N_2$=0.1 to 5%/9.9 to 49.9%/50 to 90% (a mixed gas of $NF_3$, Ar and $N_2$)

Irradiation conditions such as a cluster size, an ionizing current to be applied to an ionizing electrode of a gas cluster ion beam etching apparatus for ionizing the cluster, an accelerating voltage to be applied to an accelerating electrode of a gas cluster ion beam etching apparatus and a dose of a gas cluster ion beam can be properly selected according to the kind of the source gas and surface properties of the glass substrate after the pre-polishing. For example, for the purpose of removing waviness from the glass substrate surface to improve the flatness without excessively deteriorating the surface roughness of the glass substrate, it is preferred that the accelerating voltage to be applied to the accelerating electrode is from 15 to 30 kV.

In order to increase a driving force for the physical material removal, it is preferred that a beam current is from 80 to 200 µA.

In the finishing method of the invention, since the processing conditions of the glass substrate are set up based on the results obtained from the surface flatness measurement step and the dopant concentration distribution measurement step, the waviness generated on the glass substrate surface at the time of pre-polishing can be effectively removed, and the glass substrate can be processed into a surface having excellent flatness. When the finishing method of the invention is used, the flatness of the glass substrate surface can be improved to hot more than 50 nm.

When the finishing method of the glass substrate surface is carried out according to the foregoing procedures, there may be the case where an RMS in an HSFR region of the glass substrate surface is slightly deteriorated depending on the surface properties of the glass to be processed or the irradiation conditions with a beam. Furthermore, depending upon the specifications of the glass substrate, there may be the case where, though a desired flatness can be attained, the glass substrate surface cannot be processed to a desired RMS in an HSFR region according to the foregoing procedures.

Furthermore, there may be the case where a convex defect or a concave defect with a diameter of about 30 nm is present on the substrate surface after the finishing according to the foregoing procedures, and it is preferred that such a convex defect or concave defect is removed.

For that reason, in the finishing method of the invention, it is preferred that second finishing for improving an RMS in a high spatial frequency (HSFR) region of the glass substrate surface is further carried out. Here, it is preferred that the second finishing is able to reduce the RMS in an HSFR region of the glass substrate surface to not more than 0.15 nm.

With respect to the second finishing, gas cluster ion beam etching can be used. In that case, the gas cluster ion beam etching is carried out different from the foregoing gas cluster ion beam etching which is aimed to remove the waviness generated during the pre-polishing, while altering the irradiation conditions such as a source gas, an ionizing current and an accelerating voltage. Specifically, the gas cluster ion beam etching is carried out under milder conditions using a lower ionizing current or a lower accelerating voltage. More specifically, the accelerating voltage is preferably 3 kV or more and less than 30 kV, and more preferably from 3 to 20 kV. Furthermore, it is preferred to use, as a source gas, an $O_2$ single gas or a mixed gas of $O_2$ and at least one gas selected from the group consisting of Ar, CO and $CO_2$ because such a gas hardly causes a chemical reaction at the time of colliding with the surface of the glass substrate. Of these, it is preferred to use a mixed gas of $O_2$ and Ar.

In the case of carrying out gas cluster ion beam etching as the second finishing, for the same reasons as described above, an angle formed by the normal line of the glass substrate and an incident beam onto the glass substrate surface is kept at from 30 to 89°. The angle formed by the normal line of the glass substrate and an incident beam onto the glass substrate surface is more preferably from 50 to 85°, and especially preferably from 60 to 80°.

Furthermore, mechanical polishing using a polishing slurry at a low surface pressure, specifically at a surface pressure of from 1 to 60 $g_f/cm^2$, and preferably from 30 to 60 $g_f/cm^2$, which is called touch polishing, can be carried out as the foregoing second finishing. In the touch polishing, a glass substrate is set interposed by polishing discs provided with a polishing pad such as a non-woven fabric, a polishing cloth, etc., and the polishing discs are relatively rotated with respect to the glass substrate while feeding a slurry having been adjusted so as to have given properties, thereby achieving polishing at a surface pressure of from 1 to 60 $g_f/cm^2$, and preferably from 30 to 60 $g_f/cm^2$.

In the case of carrying out touch polishing as the second finishing, in addition to an improvement of the RMS in an HSFR region, a convex defect or a concave defect with a diameter of about 30 nm, which is present on the substrate surface, can be removed.

For example, Bellatrix K7512, manufactured by Kanebo, Ltd. is used as the polishing pad. It is preferred to use a polishing slurry containing colloidal silica as the polishing slurry. It is more preferred to use a polishing slurry containing colloidal silica with an average primary particle size of not more than 50 nm and water and having been adjusted at a pH in the range of from 0.5 to 4, The surface pressure of polishing is from 1 to 60 $g_f/cm^2$, and preferably from 30 to 60 $g_f/cm^2$. When the surface pressure exceeds 60 $g_f/cm^2$, the RMS in an HSFR region of the glass substrate surface cannot be reduced to not more than 0.15 nm due to the generation of scratches on the substrate surface or the like. Furthermore, there is a concern that a rotation load of the polishing disc becomes large. When the surface pressure is less than 1 $g_f/cm^2$, it takes a long period of time to achieve processing, and hence, such is not practically useful.

The average primary particle size of colloidal silica is more preferably less than 20 nm, and especially preferably less than 15 nm. Though a lower limit of the average primary particle size of colloidal silica is not specified, it is preferably 5 nm or more, and more preferably 10 nm or more from the viewpoint of enhancing the polishing efficiency. When the average primary particle size of colloidal silica exceeds 50 nm, it is difficult to reduce the RMS in an HSFR region of the glass substrate surface to not more than 0.15 nm. Furthermore, from the viewpoint of painstakingly controlling the particle size, it is desirable that a secondary particle formed upon cohesion of the primary particle is not contained as far as possible. Even in the case of containing a secondary particle, it is preferred that its average particle size is not more than 70 nm. The particle size of colloidal silica as referred to herein is one obtained by measuring an image with a magnification of from 15 to $105 \times 10^3$ using SEM (scanning electron microscope).

It is preferred that the content of colloidal silica in the polishing slurry is from 10 to 30% by mass. When the content of colloidal silica in the polishing slurry is less than 10% by mass, there is a concern that the polishing efficiency is so poor that economical polishing is not obtained. On the other hand, when the content of colloidal silica exceeds 30% by mass, the use amount of colloidal silica increases, and therefore, there is a concern that a hindrance is caused from the viewpoints of costs and cleaning properties. The content of colloidal silica is more preferably from 18 to 25% by mass, and especially preferably from 18 to 22% by mass.

When the pH of the polishing slurry falls within an acidic range, namely the pH is in the range of from 0.5 to 4, it is possible to chemically and mechanically polish the surface of the glass substrate, thereby efficiently polishing the glass substrate with good smoothness. That is, since convexes of the glass surface are softened by the acid of the polishing slurry, the convexes can be easily removed by mechanical polishing. As a result, not only the polishing efficiency is enhanced, but glass scum removed by polishing is softened, and therefore, the generation of new scratches by the glass scum, etc. is prevented. When the pH of the polishing slurry is less than 0.5, there is a concern that corrosion of a polishing device to be used for the touch polishing is generated. From the viewpoint of handling properties of the polishing slurry, the pH is preferably 1 or more. In order to sufficiently obtain a chemical polishing effect, the pH is preferably not more than 4, and the pH is especially preferably in the range of from 1.8 to 2.5.

The pH adjustment of the polishing slurry can be conducted by the addition of an inorganic acid or an organic acid singly or in combination. Examples of the inorganic acid which can be used include nitric acid, sulfuric acid, hydrochloric acid, perchloric acid, phosphoric acid, etc., with nitric acid being preferred from the standpoint of easiness of handling. Furthermore, examples of the organic acid include oxalic acid, citric acid, etc.

With regard to water to be used in the polishing slurry, pure water or ultrapure water from which foreign matters have been removed is preferably used. That is, pure water or ultrapure water in which the number of a fine particle having a maximum size, as measured by a light scattering system using laser light, etc., of 0.1 μm or more is substantially not more than one per mL is preferred. When foreign matters are incorporated in an amount of more than one per mL regardless of the quality or shape, there is a concern that a surface defect such as a scratch, a pit, etc. is generated on the polished surface. Though foreign matters in pure water or ultrapure water can be removed by, for example, filtration or ultrafiltration by a membrane filter, the removal method of foreign matters is not limited thereto.

In the case of using any of gas cluster ion beam etching or touch polishing, in order to reduce the RMS in an HSFR region of the glass substrate surface to not more than 0.15 nm, it is preferred that the processing amount in the second finishing is from 10 to 200 nm.

When the processing amount in the second finishing is less than 10 nm, an action to improve the RMS in an HSFR region of the glass substrate surface is insufficient. Furthermore, in the case of using touch polishing, a convex defect and a concave defect present on the substrate surface cannot be sufficiently removed. When the processing amount exceeds 200 nm, though the RMS in an HSFR region of the glass substrate surface can be improved, there is a concern that the flatness of the substrate surface is deteriorated.

The glass substrate after carrying out the foregoing second finishing is especially excellent in surface properties. Specifically, it satisfies the following requirements (1) and (2).

(1) an RMS slope in the region that 5 µm<$\lambda$(spatial wavelength)<1 mm is not more than 0.5 mRad.

(2) an RMS slope in the region that 250 nm<$\lambda$(spatial wavelength)<5 µm is not more than 0.6 mRad.

The RMS slope and a method of determining it are described in the following document.

Eric Gullikson, et al., "Proposed Specification of EUVL mask substrate roughness", 2nd International EUVL Symposium, Oct. 10, 2003

The RMS slope in the region that 5 µm<$\lambda$(spatial wavelength)<1 mm can be calculated from the results obtained by measuring an area of 10 µm square by AFM. Similarly, the RMS slope in the region that 250 nm<$\lambda$(spatial wavelength)<5 µM can be calculated from the measurement results, for example, under the following conditions using Zygo New View 5000 Series (Zygo Corporation).

Intermediate magnification: ×1
Objective lens: ×2.5

It is preferred that the glass substrate after carrying out the foregoing second finishing satisfies the following requirements (3) and (4).

(3) an RMS slope in the region that 2.5 µm<$\lambda$(spatial wavelength)<1 mm is not more than 0.45 mRad.

(4) an RMS slope in the region that 250 nm<$\lambda$(spatial wavelength)<2.5 µm is not more than 0.5 mRad.

The RMS slope in the region that 2.5 µm<$\lambda$(spatial wavelength)<1 mm can be calculated from the results obtained by measuring an area of 10 µm square by AFM. Similarly, the RMS slope in the region that 250 nm<$\lambda$(spatial wavelength)<2.5 µm can be calculated from the measurement results, for example, under the following conditions using Zygo New View 5000 Series (Zygo Corporation).

Intermediate magnification: ×1
Objective lens: ×2.5

Furthermore, it is preferred that the glass substrate after carrying out the foregoing second finishing satisfies the following requirements (5) and (6).

(5) an RMS in the region that 100 nm<$\lambda$(spatial wavelength)<1 µm is not more than 0.1 nm.

(6) an RMS in the region that 50 nm<$\lambda$(spatial wavelength)<250 nm is not more than 0.15 nm.

The RMS in the region that 100 nm<$\lambda$(spatial wavelength)<1 µm and the RMS in the region that 50 nm<$\lambda$(spatial wavelength)<250 nm can be calculated from the measurement results, for example, under the following conditions using Zygo New View 5000 Series (Zygo Corporation).

Intermediate magnification: ×1
Objective lens: ×2.5

It is more preferred that the glass substrate after carrying out the foregoing second finishing satisfies the foregoing requirements (3) to (6).

Furthermore, the glass substrate after the second finishing is also excellent in flatness and RMS in an HSFR region. Specifically, the glass substrate surface has flatness of not more than 50 nm and an RMS in an HSFR region of not more than 0.15 nm.

The glass substrate finished by the method of the invention is suitable as an optical element which is used in an optical system of an exposure tool for semiconductor production, in particular, an optical element which is used in an optical system of an exposure tool for semiconductor production of next generations having a line width of 45 nm and finer. Specific examples of such an optical element include lenses, diffraction gratings, optical membranes and complexes thereof, for example, lenses, multi-function lenses, lens arrays, lenticular lenses, fly eye lenses, non-spherical lenses, mirrors, diffraction gratings, binary optics elements, photomasks and complexes thereof.

Furthermore, the glass substrate finished by the method of the invention is especially excellent in surface properties, and therefore, it is suitable as a photomask and a mask blank for producing the photomask, in particular, a reflective type mask for use in UEVL and a mask blank for producing the mask.

The light source of the exposure tool is not particularly limited and may be a laser emitting g-line (wavelength: 436 nm) or i-line (wavelength: 365 mm) heretofore in use. However, light sources with a shorter wavelength, specifically light sources having a wavelength of not more than 250 nm are preferred. Specific examples of such a light source include a KrF excimer laser (wavelength: 248 nm), an ArF excimer laser (wavelength: 193 nm), an $F_2$ laser (wavelength: 157 nm) and EUV (13.5 nm).

EXAMPLES

The invention will be more specifically described below with reference to the following Examples, but it should not be construed that the invention is limited thereto. Examples 1 to 5 and Examples 7 to 11 are invention examples, and Examples 6 and 12 are comparative examples.

As a material to be polished, an ingot of $TiO_2$-doped synthetic quartz glass which was produced by a known method, was cut into a plate shape having a size of 153.0 mm in length×153.0 mm in width and 6.75 mm in thickness, thereby preparing a plate sample made of Ti-doped synthetic quartz glass. Subsequently, the sample was beveled with an NC beveling machine so as to have an outer dimension of 152 nm and a bevel width of from 0.2 to 0.4 mm.

The foregoing plate sample was polished using a double-sided lapping machine until the thickness reached 6.51 mm, and an outer periphery thereof was then polished using a buff, thereby achieving end-face mirror finishing.

Subsequently, the resulting plate material was subjected to primary polishing using a double-sided polishing machine. The plate sample having been mechanically polished according to the foregoing procedures was subjected to simple cleaning and precise cleaning. Thereafter, the flatness of the plate sample was measured with a flatness analyzer.

This flatness analyzer is provided with a light source, a path match route part and an interference optical system. With respect to the light source, its outgoing light flux has a coherence length shorter than twice an optical distance between front and back surfaces of the glass substrate. The path match route part divides the outgoing light flux from the light source into two light fluxes, causes one of the two light fluxes to make a detour, by a given optical path length, relative to the other of the two light fluxes, and then recombines the light fluxes into a single light flux and outputs it. The interference optical system acquires an interference fringe which carries wave surface information of the glass substrate surface by radiating the outgoing light flux from the light source onto a reference surface and the glass substrate surface held on a measurement optical axis and making lights returning from the reference surface and the glass substrate surface interfere with each other.

As a result of the measurement by the foregoing flatness analyzer, the flatness of the surface of the plate sample was found to be 337 nm/142 mm square.

Furthermore, the surface roughness of the foregoing plate sample was measured using an atomic force microscope (AFM), SPI3800N (manufactured by Seiko Instruments Inc.). As a result, the surface roughness (Rms) of the plate sample was found to be 0.2 nm.

The $TiO_2$ concentration distribution of the foregoing plate sample was measured by means of fluorescent X-ray analysis. With respect to the processing conditions, the condition for each site of the glass substrate was derived by the method described in JP-A-2007-22903. In the present Examples, waviness was removed by changing a beam scanning rate for each site of the glass substrate.

Examples 1 to 6

The above-described mechanically polished plate samples were each subjected to finishing under conditions shown in Table 1 and then to second finishing (gas cluster ion beam etching) under conditions shown in Table 2. In Tables 1 and 2, the angle formed by the normal line of the glass substrate and an incident gas cluster ion beam onto the glass substrate surface is expressed as an irradiation angle.

TABLE 1

|  | Example 1 | Example 2 | Example 3 | Example 4 | Example 5 | Example 6 |
| --- | --- | --- | --- | --- | --- | --- |
| Accelerating voltage (kV) | 30 | 20 | 20 | 20 | 20 | 20 |
| Cluster size (number) | 3000 | 5000 | 3000 | 3000 | 3000 | 3000 |
| Beam current (μA) | 80 | 80 | 150 | 80 | 80 | 50 |
| Beam diameter (mm) | 8 | 8 | 8 | 8 | 8 | 8 |
| Irradiation angle (°) | 45 | 45 | 45 | 80 | 45 | 2 |
| Source gas | $NF_3$ | $NF_3$ | $NF_3$ | $NF_3$ | Ar | $NF_3$ |

TABLE 2

|  | Example 1 | Example 2 | Example 3 | Example 4 | Example 5 | Example 6 |
| --- | --- | --- | --- | --- | --- | --- |
| Accelerating voltage (kV) | 15 | 15 | 15 | 15 | 15 | 15 |
| Cluster size (number) | 2000 | 2000 | 2000 | 2000 | 2000 | 2000 |
| Beam current (μA) | 150 | 150 | 150 | 150 | 150 | 150 |
| Irradiation angle (°) | 45 | 45 | 45 | 45 | 45 | 45 |
| Source gas | $O_2$ | $O_2$ | $O_2$ | $O_2$ | $O_2$ | $O_2$ |

Examples 7 to 12

The above-described mechanically polished plate samples were each subjected to finishing under conditions shown in Table 3 and then to second finishing (touch polishing) under conditions shown in Table 4. In Table 3, the angle formed by the normal line of the glass substrate and an incident gas cluster ion beam onto the glass substrate surface is expressed as an irradiation angle.

TABLE 3

|  | Example 7 | Example 8 | Example 9 | Example 10 | Example 11 | Example 12 |
|---|---|---|---|---|---|---|
| Accelerating voltage (kV) | 30 | 20 | 20 | 20 | 20 | 20 |
| Cluster size (number) | 3000 | 5000 | 3000 | 3000 | 3000 | 3000 |
| Beam current (µA) | 80 | 80 | 150 | 80 | 80 | 50 |
| Beam diameter (mm) | 8 | 8 | 8 | 8 | 8 | 8 |
| Irradiation angle (°) | 45 | 45 | 45 | 80 | 45 | 2 |
| Source gas | $NF_3$ | $NF_3$ | $NF_3$ | $NF_3$ | Ar | $NF_3$ |

TABLE 4

|  | Example 7 | Example 8 | Example 9 | Example 10 | Example 11 | Example 12 |
|---|---|---|---|---|---|---|
| Surface pressure (gf/cm$^2$) | 10 | 10 | 10 | 10 | 10 | 10 |
| Average primary particle size of colloidal silica in polishing slurry (nm) | 15 to 20 | 15 to 20 | 15 to 20 | 15 to 20 | 15 to 20 | 15 to 20 |
| Content of colloidal silica in polishing slurry (% by mass) | 20 | 20 | 20 | 20 | 20 | 20 |
| pH of polishing slurry | 2 | 2 | 2 | 2 | 2 | 2 |

With respect to the samples of the foregoing Examples 1 to 12, an RMS slope (RMS1) in the region that 5 µm<λ(spatial wavelength)<1 mm, an RMS slope (RMS2) in the region that 250 nm<λ(spatial wavelength)<5 µm an RMS slope (RMS3) in the region that 2.5 µm<λ(spatial wavelength)<1 mm, an RMS slope (RMS4) in the region that 250 nm<λ(spatial wavelength)<2.5 µm, an RMS (RMS5) in the region that 100 nm<λ(spatial wavelength)<1 µm and an RMS (RMS6) in the region that 50 nm<λ(spatial wavelength)<250 nm were measured with the above-described flatness analyzer and atomic force microscope (AFM). The results are shown in Tables 5 and 6.

TABLE 5

|  | Example 1 | Example 2 | Example 3 | Example 4 | Example 5 | Example 6 |
|---|---|---|---|---|---|---|
| Flatness (nm) | 258 | 612 | 443 | 356 | 182 | 325 |
| HSFR (nm) | 62 | 48 | 71 | 38 | 55 | 58 |
| RMS1 (mRad) | 0.40 | 0.34 | 0.31 | 0.37 | 0.40 | 0.52 |
| RMS2 (mRad) | 0.33 | 0.32 | 0.38 | 0.42 | 0.41 | 0.51 |
| RMS3 (mRad) | 0.44 | 0.39 | 0.36 | 0.41 | 0.44 | 0.55 |
| RMS4 (mRad) | 0.30 | 0.29 | 0.35 | 0.40 | 0.37 | 0.47 |
| RMS5 (nm) | 0.048 | 0.039 | 0.041 | 0.032 | 0.045 | 0.12 |
| RMS6 (nm) | 0.09 | 0.11 | 0.11 | 0.10 | 0.12 | 0.11 |

TABLE 6

|  | Example 7 | Example 8 | Example 9 | Example 10 | Example 11 | Example 12 |
|---|---|---|---|---|---|---|
| Flatness (nm) | 513 | 348 | 332 | 337 | 211 | 325 |
| HSFR (nm) | 44 | 67 | 51 | 50 | 72 | 62 |
| RMS1 (mRad) | 0.38 | 0.34 | 0.29 | 0.39 | 0.39 | 0.59 |
| RMS2 (mRad) | 0.32 | 0.32 | 0.38 | 0.41 | 0.43 | 0.45 |
| RMS3 (mRad) | 0.42 | 0.38 | 0.35 | 0.43 | 0.41 | 0.62 |
| RMS4 (mRad) | 0.28 | 0.27 | 0.36 | 0.38 | 0.40 | 0.38 |
| RMS5 (nm) | 0.038 | 0.044 | 0.032 | 0.038 | 0.042 | 0.12 |
| RMS6 (nm) | 0.09 | 0.11 | 0.11 | 0.10 | 0.12 | 0.11 |

Under the conditions of Examples 6 and 12, RMS2, 4 and 6 were attained. However, since the driving force for the chemical material removal was high and hence they were susceptible to the influence of material non-uniformity, RMS1, 3 and 5 were not attained.

On the other hand, in Examples 1 to 3, Examples 7 to 9 and Examples 5 and 11, by enhancing the driving force for the physical material removal according to the following changes, they were made to be not susceptible to the influence of material non-uniformity, thereby simultaneously attaining RMS1 to RMS6.

In Examples 1 and 7, by increasing the accelerating voltage at the time of finishing, the collision speed of a cluster was increased, and the driving force for the physical material removal was enhanced, thereby making concaves and convexes (RMS slope) of the surface small.

In Examples 2 and 8, by enhancing the size of the cluster at the time of finishing, the physical energy per unit cluster during the collision was enhanced, thereby making concaves and convexes (RMS slope) of the surface small.

In Examples 3 and 9, by increasing the beam current at the time of finishing, the driving force for the physical material removal was enhanced, thereby making concaves and convexes (RMS slope) of the surface small.

In Examples 4 and 10, by increasing the irradiation angle at the time of finishing, the cluster enters the surface of the substrate at a low angle. As a result, the convexes of the material became readily removable selectively, thereby making concaves and convexes (RMS slope) of the surface small.

In Examples 5 and 11, by changing the source gas at the time of finishing from one having a large driving force for the chemical material removal to one having a small driving force, the driving force for the physical material removal was relatively enhanced, thereby making concaves and convexes (RMS slope) of the surface small.

While the invention has been described in detail and with reference to specific embodiments thereof, it will be apparent to one skilled in the art that various changes and modifications can be made therein without departing from the spirit and scope thereof.

This application is based on Japanese Patent Application No 2006-325286, filed Dec. 1, 2006, the contents of which are incorporated herein by reference.

INDUSTRIAL APPLICABILITY

Since the glass substrate finished by the method of the invention is excellent in RMS slope, RMS in an HSFR region and flatness, it is suitable for an optical element of an optical system of an exposure tool, in particular, an optical element to be used in an optical system of an exposure tool for semiconductor production of next generations having a line width of 45 nm or finer; and for a photomask and a mask blank to be used for the production thereof, in particular, a reflective type mask for use in EUVL; and for a mask blank to be used for the production of the mask.

The invention claimed is:

1. A method for finishing a pre-polished glass substrate surface of a glass substrate, comprising:
providing a glass substrate made quartz glass containing a dopant and comprising $SiO_2$ as a main component;
measuring flatness of a pre-polished glass substrate surface of the glass substrate using a shape measurement unit that comprises: a low-coherent light source whose outgoing light flux has a coherence length shorter than twice an optical distance between front and back surfaces of the glass substrate; a path match route part that divides the outgoing light flux from the low-coherent light source into two light fluxes, causes one of the two light fluxes to make a detour by a given optical path length relative to the other light flux, and then recombines the light fluxes into a single light flux and outputs the single light flux; and an interference optical system that acquires an interference fringe which carries wave surface information of the glass substrate surface by radiating an outgoing light flux from the low-coherent light source onto a reference surface and the glass substrate surface held on a measurement optical axis and making lights returning from the reference surface and the glass substrate surface interfere with each other;
measuring a concentration distribution of the dopant contained in the glass substrate;
setting up processing conditions of the glass substrate surface for each site of the glass substrate based on results obtained from the measuring of flatness of the glass substrate and the measuring of a concentration distribution of the dopant contained in the glass substrate; and
finishing while keeping an angle formed by a normal line of the glass substrate and an incident beam generated by a processing method of one of ion beam etching, gas cluster ion beam etching and plasma etching onto the glass substrate surface at from 30 to 89°,
wherein correlation between the concentration of the dopant and the processing rate of the glass substrate surface is determined beforehand,
after measuring the flatness of the glass substrate surface, a given amount of the glass substrate surface is processed under processing conditions, and the flatness of the glass substrate surface after the processing is then measured, and
the concentration distribution of the dopant contained in the glass substrate is measured using a difference in the flatness of the glass substrate surface before and after the processing and the correlation between the concentration of the dopant and the processing rate.

2. The method for finishing a pre-polished glass substrate surface according to claim 1, wherein the flatness of the glass substrate surface before and after the processing is measured using the shape measurement unit comprising the low-coherent light source, the path match route part and the interference optical system.

3. The method for finishing a pre-polished glass substrate surface according to claim 1, wherein a width of waviness present on the glass substrate surface is specified from results of the step of measuring flatness of the glass substrate surface, and the processing is carried out using a beam having a beam diameter of not more than the width of the waviness in terms of an FWHM value.

4. The method for finishing a pre-polished glass substrate surface according to claim 3, wherein the FWHM value of the beam diameter is not more than one-half the width of the waviness.

5. The method for finishing a pre-polished glass substrate surface according to claim 1, wherein the processing method is gas cluster ion beam etching; and one of mixed gases selected from the group consisting of a mixed gas of $SF_6$ and $O_2$, a mixed gas of $SF_6$, Ar and $O_2$, a mixed gas of $NF_3$ and $O_2$, a mixed gas of $NF_3$, Ar and $O_2$, a mixed gas of $NF_3$ and $N_2$, and a mixed gas of $NF_3$, Ar and $N_2$ is used as a source gas of the gas cluster ion beam etching.

6. The method for finishing a pre-polished glass substrate surface according to claim 1, wherein the glass substrate is made of a low-expansion glass having a coefficient of thermal expansion at 20° C. of 0±30 ppb/° C.

7. The method for finishing a pre-polished glass substrate surface according to claim 1, wherein the dopant is $TiO_2$.

8. The method for finishing a pre-polished glass substrate surface according to claim 1, wherein the glass substrate has an RMS in a high spatial frequency region of the substrate surface after the pre-polishing of not more than 5 nm.

9. The method for finishing a pre-polished glass substrate surface according to claim 1, wherein the glass substrate surface finished by setting up the processing conditions for each site of the glass substrate is further subjected to second finishing for improving an RMS in a high spatial frequency region.

10. The method for finishing a pre-polished glass substrate surface according to claim 9, wherein the second finishing is carried out by gas cluster ion beam etching while keeping an angle formed by a normal line of the glass substrate and an incident gas cluster ion beam into the glass substrate surface at from 30 to 89° and using, as a source gas, an $O_2$ single gas or a mixed gas of $O_2$ and at least one gas selected from the group consisting of Ar, CO and $CO_2$ at an accelerating voltage of 3 kV or more and less than 30 kV.

11. The method for finishing a pre-polished glass substrate surface according to claim 9, wherein the second finishing is carried out by mechanical polishing using a polishing slurry at a surface pressure of from 1 to 60 $g_f/cm^2$.

12. The method for finishing a pre-polished glass substrate surface according to claim 2, wherein a width of waviness present on the glass substrate surface is specified from results of the step of measuring flatness of the glass substrate surface, and the processing is carried out using a beam having a beam diameter of not more than the width of the waviness in terms of an FWHM value.

13. The method for finishing a pre-polished glass substrate surface according to claim 12, wherein the FWHM value of the beam diameter is not more than one-half the width of the waviness.

14. The method for finishing a pre-polished glass substrate surface according to claim 2, wherein the processing method is gas cluster ion beam etching; and one of mixed gases selected from the group consisting of a mixed gas of $SF_6$ and $O_2$, a mixed gas of $SF_6$, Ar and $O_2$, a mixed gas of $NF_3$ and $O_2$, a mixed gas of $NF_3$, Ar and $O_2$, a mixed gas of $NF_3$ and $N_2$, and a mixed gas of $NF_3$, Ar and $N_2$ is used as a source gas of the gas cluster ion beam etching.

15. The method for finishing a pre-polished glass substrate surface according to claim 2, wherein the glass substrate is made of a low-expansion glass having a coefficient of thermal expansion at 20° C. of 0±30 ppb/° C.

16. The method for finishing a pre-polished glass substrate surface according to claim 2, wherein the dopant is $TiO_2$.

17. The method for finishing a pre-polished glass substrate surface according to claim 2, wherein the glass substrate has an RMS in a high spatial frequency region of the substrate surface after the pre-polishing of not more than 5 nm.

18. The method for finishing a pre-polished glass substrate surface according to claim 2, wherein the glass substrate surface finished by setting up the processing conditions for each site of the glass substrate is farther subjected to second finishing for improving an RMS in a high spatial frequency region.

19. The method for finishing a pre-polished glass substrate surface according to claim 18, wherein the second finishing is carried out by gas cluster ion beam etching while keeping an angle formed by a normal line of the glass substrate and an incident gas cluster ion beam into the glass substrate surface at from 30 to 89° and using, as a source gas, an $O_2$ single gas or a mixed gas of $O_2$ and at least one gas selected from the group consisting of Ar, CO and $CO_2$ at an accelerating voltage of 3 kV or more and less than 30 kV.

20. The method for finishing a pre-polished glass substrate surface according to claim 18, wherein the second finishing is carried out by mechanical polishing using a polishing slurry at a surface pressure of from 1 to 60 $g_f/cm_2$.

* * * * *